(12) United States Patent
Yeh et al.

(10) Patent No.: US 12,406,897 B2
(45) Date of Patent: Sep. 2, 2025

(54) PACKAGE STRUCTURE WITH BUFFER LAYER EMBEDDED IN LID LAYER

(71) Applicant: Taiwan Semiconductor Manufacturing Company, Ltd., Hsinchu (TW)

(72) Inventors: Shu-Shen Yeh, Taoyuan (TW); Yu-Sheng Lin, Hsinchu (TW); Ming-Chih Yew, Hsinchu (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/658,981

(22) Filed: May 8, 2024

(65) Prior Publication Data

US 2024/0290682 A1    Aug. 29, 2024

Related U.S. Application Data

(63) Continuation of application No. 17/984,259, filed on Nov. 10, 2022, now Pat. No. 12,009,278, which is a continuation of application No. 17/185,986, filed on Feb. 26, 2021, now Pat. No. 11,527,457.

(51) Int. Cl.
| | |
|---|---|
| *H01L 23/367* | (2006.01) |
| *H01L 23/24* | (2006.01) |
| *H01L 25/00* | (2006.01) |
| *H01L 25/18* | (2023.01) |

(52) U.S. Cl.
CPC .......... *H01L 23/3675* (2013.01); *H01L 23/24* (2013.01); *H01L 25/18* (2013.01); *H01L 25/50* (2013.01)

(58) Field of Classification Search
CPC ..... H01L 23/3675; H01L 23/24; H01L 25/18; H01L 25/50; H01L 23/16
See application file for complete search history.

(56) References Cited

U.S. PATENT DOCUMENTS

| | | | |
|---|---|---|---|
| 6,011,304 A * | 1/2000 | Mertol | H01L 23/04 257/710 |
| 7,002,246 B2 * | 2/2006 | Ho | H01L 23/36 257/E23.101 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |

(Continued)

*Primary Examiner* — Thao P Le
(74) *Attorney, Agent, or Firm* — JCIPRNET

(57) ABSTRACT

Provided is a package structure including a substrate, a stiffener ring, an eccentric die, a lid layer, and a buffer layer. The stiffener ring is disposed on the substrate. The stiffener ring has an inner perimeter to enclose an accommodation area. The eccentric die is disposed within the accommodation area on the substrate. The eccentric die is offset from a center of the accommodation area to close to a first side of the stiffener ring. The lid layer is disposed on the stiffener ring and overlays the eccentric die. The buffer layer is embedded in the lid layer between the first side of the stiffener ring and the eccentric die. The buffer layer has a thickness less than a thickness of the lid layer.

20 Claims, 13 Drawing Sheets

(56) References Cited

U.S. PATENT DOCUMENTS

| | | | |
|---|---|---|---|
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2009/0108429 A1* | 4/2009 | Tsao | H01L 23/4006 |
| | | | 257/E23.101 |
| 2012/0182694 A1* | 7/2012 | Lin | H01L 23/16 |
| | | | 361/728 |
| 2022/0028773 A1* | 1/2022 | Lu | H01L 25/03 |
| 2022/0319871 A1* | 10/2022 | Shah | H01L 21/566 |
| 2022/0359322 A1* | 11/2022 | Hung | H01L 23/16 |
| 2023/0021005 A1* | 1/2023 | Chiou | H01L 23/5385 |
| 2025/0070084 A1* | 2/2025 | Lee | H01L 25/0655 |
| 2025/0149524 A1* | 5/2025 | Fan | H01L 24/29 |
| 2025/0210568 A1* | 6/2025 | Lin | H01L 24/24 |

* cited by examiner

PACKAGE STRUCTURE WITH BUFFER LAYER EMBEDDED IN LID LAYER

CROSS-REFERENCE TO RELATED APPLICATION

This application is a continuation application of and claims the priority benefit of a prior application Ser. No. 17/984,259, filed on Nov. 10, 2022, now allowed. The U.S. application Ser. No. 17/984,259 is a continuation application of and claims the priority benefit of U.S. application Ser. No. 17/185,986, filed on Feb. 26, 2021, now U.S. Pat. No. 11,527,457, issued on Dec. 13, 2022. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
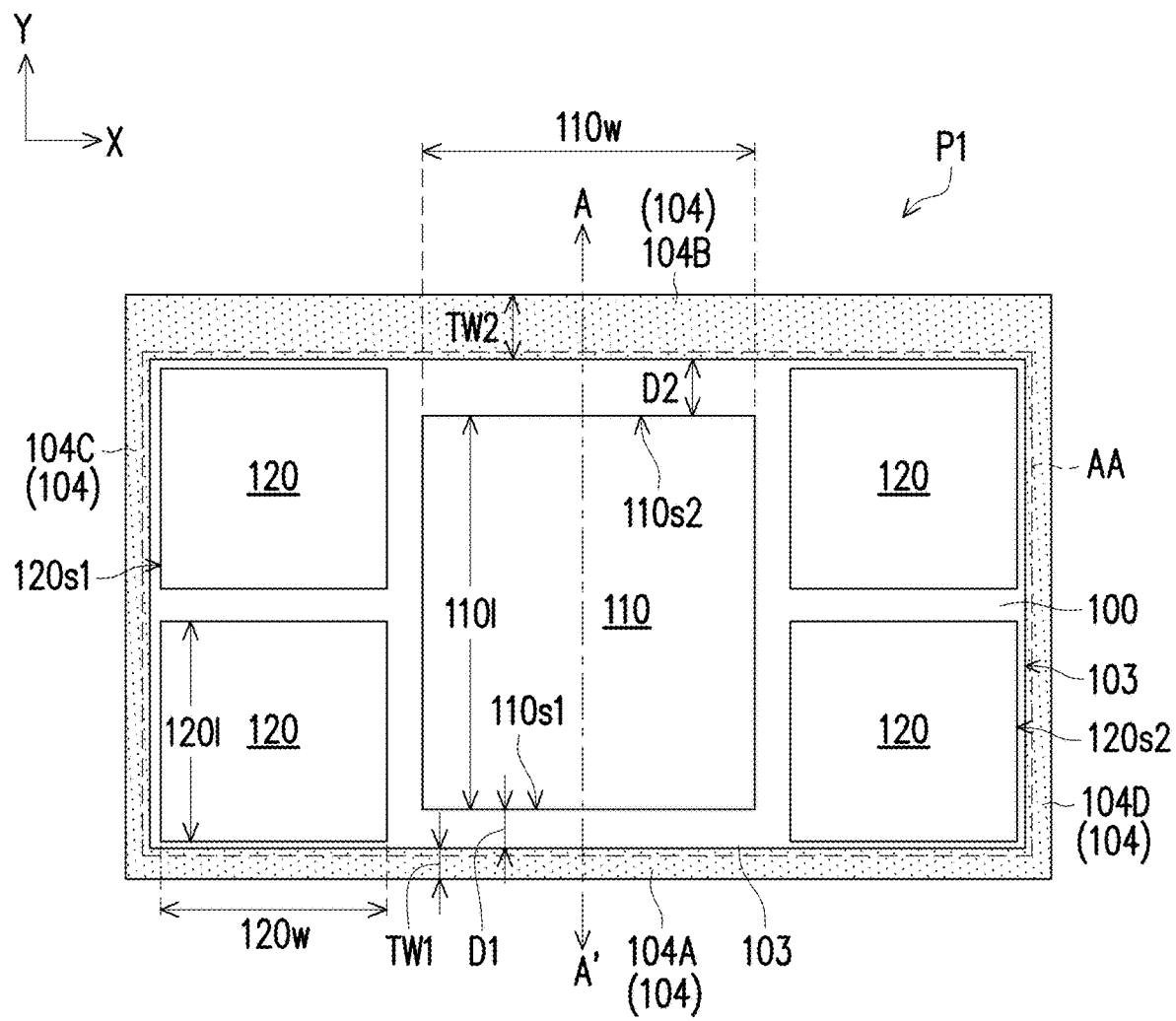
FIG. 1A is a top view showing a package structure in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In the semiconductor package industry, a chip having an integrated circuit is commonly mounted on a package substrate such as an interposer, a circuit board or a lead frame that provides electrical connections from the chip to the exterior of the package structure. In such packaging arrangement called flip chip mounting, where an active surface of the chip is mounted in an upside-down manner on the substrate, the chip and the substrate are usually formed of different materials having mismatched coefficients of thermal expansion (CTE). As a result, the chip and the substrate experience significantly different dimension changes when heated, and the mismatch in dimension changes causes significant thermally-induced stresses and warpage in the electrical connections between the chip and the substrate. If uncompensated, the disparity in thermal expansion can result in degradation in the performance of the chip, damage to the solder connections between the chip and the substrate, or package failure.

To reduce warpage and improve the reliability of flip chip packages, a number of approaches have been offered by the microelectronics industry. A stiffener is typically employed around the chip in the package assembly. The stiffener is attached on the substrate and surround the chip to constrain the substrate in order to prevent chip warpage or other movement relative to the chip during thermal cycling. To further reduce the chance of warpage and promote thermal cooling of flip chip packages, a lid or heat spreader is often mounted on top of the package to dissipate heat and counterbalance the forces exerted by the thermal expansion mismatches between at least the chip and the substrate.

With the diversification of electronic products, the chip in the package may be arranged at any position on the substrate to accommodate more components, such as capacitors, resistors, inductors, or any suitable passive components. When the chip is offset from a center of the substrate to approach one side of the stiffener to make more room for the passive components, the thermally-induced stress will focus on the side of the stiffener close to the chip. In this case, the stress due to the CTE mismatch may cause the delamination or crack issue of the adhesive coupled between the stiffener and the lid, thereby affecting the reliability of the package structure.

In accordance with some embodiments, an opening is formed in a lid layer between a first side of a stiffener ring and an eccentric die to break the stress caused by the CTE mismatch, thereby avoiding the crack and/or delamination issue of the adhesive layer and enhancing the reliability of the package structure. In addition, a buffer layer (or an embedded buffer/portion) is formed in an upper portion of the opening to prevent the electromagnetic interference (EMI).

Figure 1B:
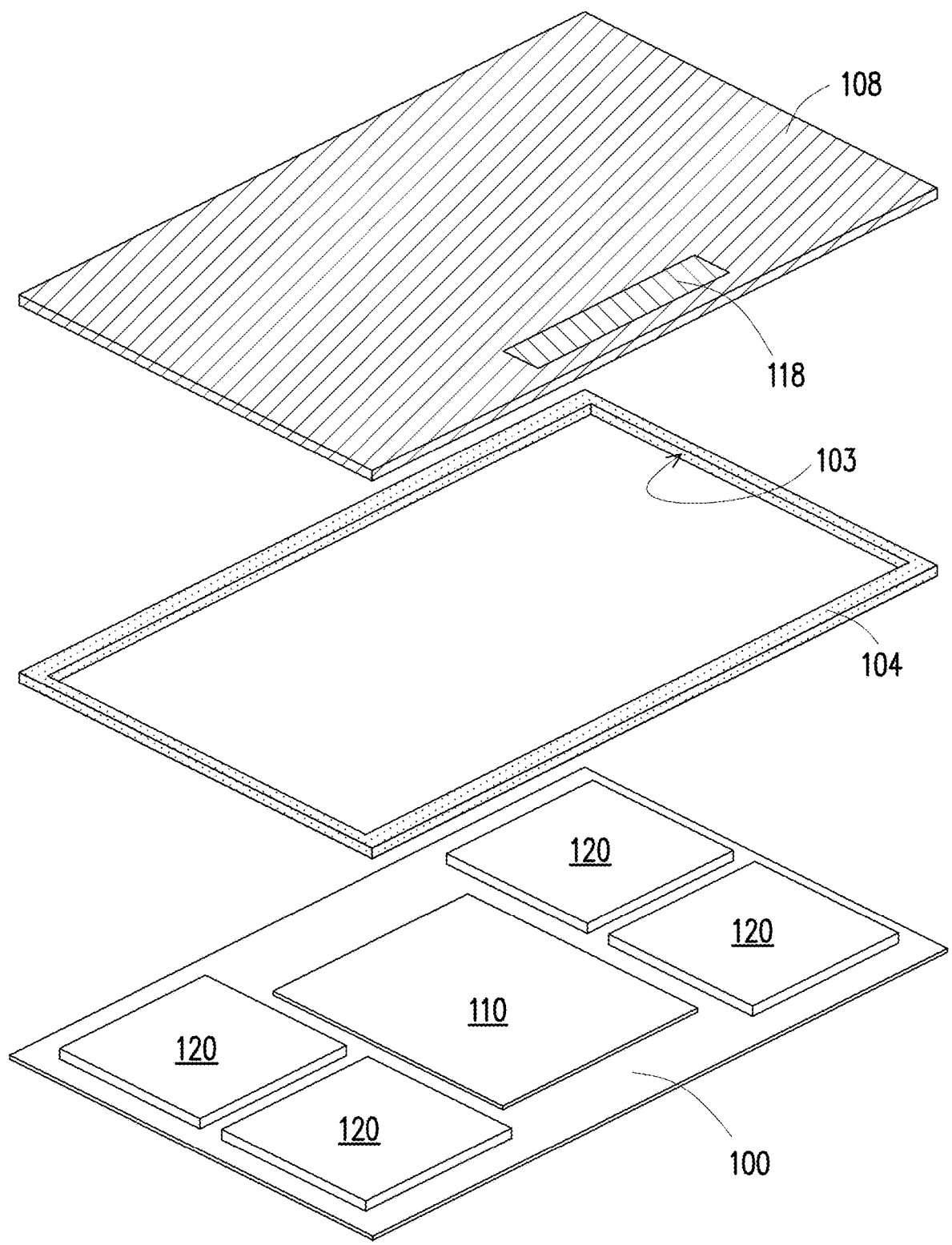
FIG. 1B is an explosive view illustrating the package structure depicted in FIG. 1A.
Figure 1C:
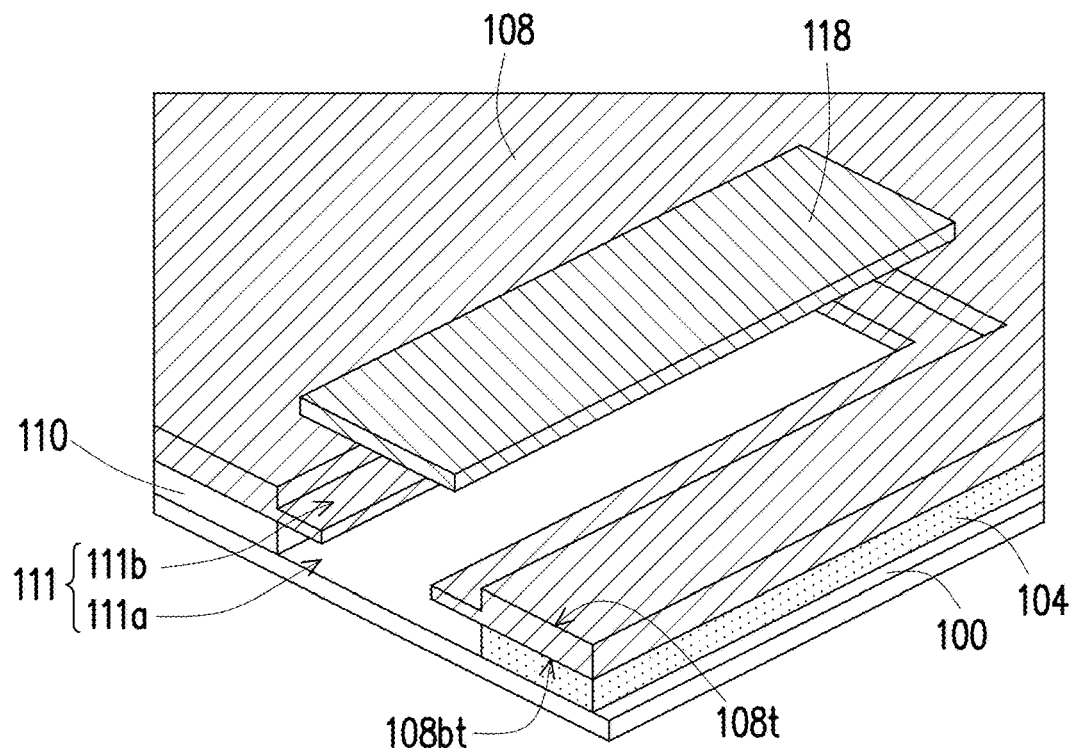
FIG. 1C is a perspective view illustrating a portion of the package structure depicted in FIG. 1A.
Figure 1D:
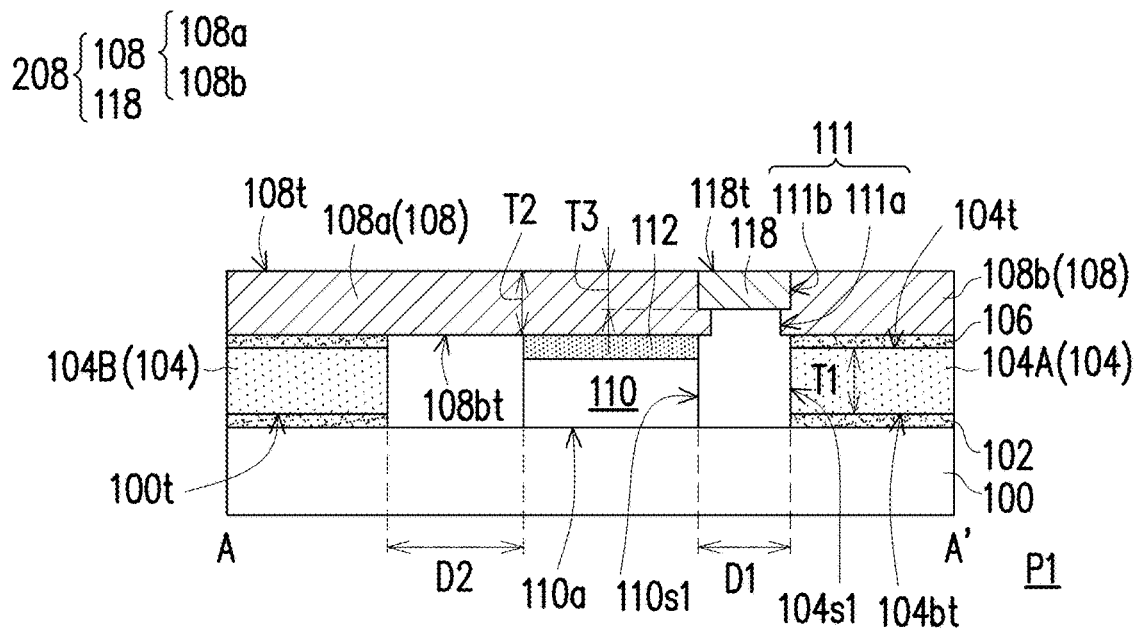
FIG. 1D is a cross-sectional view along a cross-section A-A' of FIG. 1A.

FIG. 1A is a top view showing a package structure in accordance with a first embodiment. FIG. 1B is an explosive view illustrating the package structure depicted in FIG. 1A. FIG. 1C is a perspective view illustrating a portion of the package structure depicted in FIG. 1A. FIG. 1D is a cross-sectional view along a cross-section A-A' of FIG. 1A.

Referring to FIG. 1A to FIG. 1D, a package structure P1 includes a substrate 100, a first adhesive layer 102, a stiffener ring 104, a second adhesive layer 106, a lid layer 108, a buffer layer 118, a first die 110, and a plurality of second dies 120. For the clarity, the lid layer 108 and the buffer layer 118 are not shown in FIG. 1A. For the configuration of the lid layer 108 and the buffer layer 118, please refer to FIG. 1B to FIG. 1D.

In some embodiments, the substrate 100 includes a package substrate, a circuit substrate, or an interposer (hereinafter called "package substrate 100"). The package substrate 100 may include based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 100.

The package substrate 100 may include active and passive devices (not shown). As one of ordinary skill in the art will recognize, a wide variety of devices such as transistors, capacitors, resistors, combinations of these, and the like may be used to provide structural and functional designs for the package structure P1. The devices may be formed using any suitable methods.

The package substrate 100 may also include metallization layers, vias, and bond pads over the metallization layers and vias (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 100 is substantially free of active and passive devices.

As shown in FIG. 1A, the first die 110 and the second dies 120 are mounted side by side on the package substrate 100. In detail, the first die 110 is disposed between the second dies 120. In some embodiments, the first die 110 and the second dies 120 may have different functions or sizes. Herein, the term "size" is referred to the length, width, or area. For example, as shown in FIG. 1A, a length 110l and/or a width 110w of the first die 110 is greater than a length 120l and/or a width 120w of one of the second dies 120. Although the detail components in the first die 110 is not illustrated in the cross-sectional view of FIG. 1D, the first die 110 is mounted onto the package substrate 100 by a flip-chip manner. That is, an active surface 110a of the first die 110 faces and is bonded on a top surface 100t of the package substrate 100.

In some embodiments, the first die 110 includes a system on a chip or system on chip (SoC) including several different integrated circuits, i.e. ICs or processors, together with memories and I/O interfaces. Each of the integrated circuit integrates various components of a computer or other electronic systems into one semiconductor chip. The various components contain digital, analog, mixed-signal, and often radio-frequency functions. Also, the SoC integrates processors (or controllers) with advanced peripherals like a graphics processing unit (GPU), a Wi-Fi module, or a co-processor. In the architecture of the SoC, both logic components and memory components are fabricated in the same silicon wafer. For high efficiency computing or mobile devices, multi-core processors are used, and the multi-core processors include large amounts of memories, such as several gigabytes. In some alternative embodiments, the first die 110 may be an application-specific integrated circuit (ASIC) die.

In some embodiments, one of the second dies 120 includes a memory die, such as high bandwidth memory (HBM) die, dynamic random-access memory (DRAM) die, static random-access memory (SRAM) die, or a combination thereof. Alternatively, one of the second dies 120 may include a chip scale package (CSP) with a memory function. In such embodiment, the second die 120 may be referred to as a package die. In other embodiments, one of the second dies 120 may include a logic die, such as a central processing unit (CPU) die, a graphic processing unit (GPU) die, a micro control unit (MCU) die, an input-output (I/O) die, a baseband (BB) die, or an application processor (AP) die. Although four second dies 120 is illustrated in FIG. 1A to surround one first die 110, the embodiments of the present disclosure are not limited thereto. In other embodiments, the number of the first die 110 and the second dies 120 are adjusted by the need. In some embodiments, the first die 110 and the second dies 120 have different coefficients of thermal expansion (CTE). The CTE of first die 110 is less than the CTE of the second dies 120. For example, the CTE of the first die 110 is in a range of 2.5 ppm/° C. to 3.5 ppm/° C., such as 3 ppm/° C., and the CTE of the second dies 120 is in a range of 8 ppm/° C. to 25 ppm/° C., such as 17 ppm/° C.

Referring to FIG. 1B and FIG. 1D, the first adhesive layer 102 is formed on the package substrate 100. In some embodiments, the first adhesive layer 102 includes any suitable adhesive, epoxy, die attach film (DAF), or the like. Alternatively, the first adhesive layer 102 may be a thermally conductive material.

Thereafter, the stiffener ring 104 is adhered on the package substrate 100 by the first adhesive layer 102. The stiffener ring 104 may be a rigid ring-like structure having substantially the same dimensions as the package substrate 100. In some embodiments, stiffener ring 104 are pre-fabricated and available from material suppliers. As shown in FIG. 1A, the stiffener ring 104 has an inner sidewall (or inner perimeter) 103 facing and surrounding the first die 110 and the second dies 120. The inner sidewall 103 may enclose an accommodation area AA, and the first die 110 and the second dies 120 are disposed on the package substrate 100 within the accommodation area AA. In other words, the stiffener ring 104 may have a window in its center to expose the dies 110 and 120 and allow for the heat transfer. Noted that the stiffener ring 104 is attached on the package substrate 100 and surrounds the dies 110 and 120 to constrain the package substrate 100 in order to prevent its warpage or other movement relative to the first and second dies 110 and 120, which may be caused by thermal cycling during package assembly, reliability testing, or field operation. The warpage and stress in the dies or package may lead to die performance degradation or package failure. In some embodiments, a thickness T1 of the stiffener ring 104 measured between the top surface 104$t$ and the bottom surface 104$bt$ may be smaller than 4000 μm.

In some embodiments, the stiffener ring 104 is formed of a rigid yet flexible material. In one exemplary embodiment, the stiffener ring 104 is formed from a metal material with high thermal conductivity (k), such as steel, stainless steel, copper, aluminum, copper tungsten, the like, or combinations thereof. In another embodiment, the stiffener ring 104 includes a ceramic material. In yet another embodiment, the stiffener ring 104 includes a silicon containing material. In yet another embodiment, the stiffener ring 104 includes a composite alloy. In yet another embodiment, the stiffener ring 104 includes a plastic material. In the present embodiment, the material of the stiffener ring 104 is typically selected to have a CTE the same as or sufficiently similar to the package substrate 100 in order to apply a counter force to the package substrate 100 and reduce the bow of the package structure P1 to within tolerances accepted in the industry. For example, the CTE of the stiffener ring 104 is smaller than 25 ppm/° C., such as 17 ppm/° C., and the CTE of the package substrate 100 is in a range of 8 ppm/° C. to 25 ppm/° C., such as 17 ppm/° C.

As shown in FIG. 1A, the stiffener ring 104 may have a first portion 104A, a second portion 104B, a third portion 104C, and a fourth portion 104D. Specifically, the first portion 104A is adjacent to a first sidewall 110$s$1 of the first die 110, and the second portion 104B is adjacent to a second sidewall 110$s$2 of the first die 110 opposite to the first sidewall 110$s$1. In addition, the third portion 104C is adjacent to a first sidewall 120$s$1 of the second die 120 and connects the first portion 104A and the second portion 104B. The fourth portion 104D is adjacent to a second sidewall 120$s$2 of the second die 120 opposite to the first sidewall 120$s$1 and connects the first portion 104A and the second portion 104B. In the top view of FIG. 1A, the first, second, third, and fourth portions 104A, 104B, 104C, and 104D are connected to form a rectangular ring structure. However, the embodiments of the present disclosure are not limited thereto. In other embodiments, the stiffener ring 104 may be various ring structures, such as a circular ring structure or a polygonal ring structure.

As shown in FIG. 1B and FIG. 1D, after attaching the stiffener ring 104 on the package substrate 100 by the first adhesive layer 102, the second adhesive layer 106 is formed on a top surface 104$t$ of the stiffener ring 104. The second adhesive layer 106 may include any suitable adhesive, epoxy, die attach film (DAF), or the like. Alternatively, the second adhesive layer 106 may be a thermally conductive material. In some embodiments, the first adhesive layer 102 and the second adhesive layer 106 have the same material or different materials.

After forming the second adhesive layer 106 on the top surface 104$t$ of the stiffener ring 104, the lid layer 108 is adhered on the stiffener ring 104 by the second adhesive layer 106. The lid layer 108 may be coupled to the stiffener ring 104 to increase the rigid of the stiffener ring 104, thereby reducing the warpage of the package structure P1. In some embodiments, the lid layer 108 is formed from a metal material with high thermal conductivity (k), such as steel, stainless steel, copper, aluminum, copper tungsten, the like, or combinations thereof. In another embodiment, the lid layer 108 includes a ceramic material. In yet another embodiment, the lid layer 108 includes a silicon containing material. In yet another embodiment, the lid layer 108 includes a composite alloy. In yet another embodiment, the lid layer 108 includes a plastic material. In some other embodiments, the lid layer 108 is a single contiguous material. In another embodiment, the lid layer 108 includes multiple pieces that may be the same or different materials. In the present embodiment, the lid layer 108 and the stiffener ring 104 have the same material with the same CTE to avoid the stress due to the CTE mismatch. In some embodiments, the lid layer 108 has a thickness T2 in a range of 200 μm to 1000 μm. The thickness T2 of the lid layer 108 may be greater than, substantially equal to, or less than the thickness T1 of the stiffener ring 104.

As shown in FIG. 1C, in some embodiments, the lid layer 108 has an opening 111 penetrating through a top surface 108$t$ and a bottom surface 108$bt$ of the lid layer 108. The opening 111 may include a lower opening 111$a$ and an upper opening 110$b$ on the lower opening 111$a$. The lower opening 111$a$ may be in spatial communication with the upper opening 110$b$. In some embodiments, the upper opening 111$b$ has an area greater than an area of the lower opening 111$a$.

It should be noted that, in the present embodiment, the first die 110 is an eccentric die offset from a center of the accommodation area AA to close to the first portion 104A of the stiffener ring 104, thereby making more room between the second sidewall 110$s$2 and the second portion 104B for accommodating more components, such as passive components. That is, as shown in FIG. 1A, a first distance D1 between the first sidewall 110$s$1 of the first die 110 and the first portion 104A is less than a second distance D2 between the second sidewall 110$s$2 of the first die 110 and the second portion 104B. In this case, the thermally-induced stress will focus on the first portion 104A of the stiffener ring 104 close to the first die 110. In order to solve the said localized stress concentration issue, in the present embodiment, as shown in FIG. 1D, the opening 111 is formed in the lid layer 108 between a first side 104s1 of the stiffener ring 104 and the first sidewall 110s1 of the first die 110 to break the stress caused by the CTE mismatch, thereby avoiding the crack and/or delamination issue of the second adhesive layer 106 and enhancing the reliability of the package structure P1. In some embodiments, the first distance D1 is smaller than 5000 μm, the second distance D2 is smaller than 5000 μm, and a ratio (D1/D2) of the first distance D1 to the second distance D2 is in a range of 0 to 1. In some embodiments, the first portion 104A of the stiffener ring 104 has a first top width (or top area) TW1 less than a second top width (or top area) TW2 of the second portion 104B of the stiffener ring 104. However, the embodiments of the present disclosure are not limited thereto. In other embodiments, the first top width TW1 of the first portion 104A may be substantially equal to or greater than the second top width TW2 of the second portion 104B.

The first die 110 may be offset along a first direction Y, from a center of the package substrate 100, and substantially symmetrical along a second direction X in some embodiment, but not limited thereto. That is, a distance between a sidewall of the first die 110 and a corresponding sidewall of the package substrate 100 (such as a sum of width TW1 and the first distance D1) is smaller than an opposite distance between a opposite sidewall of the first die 110 and a corresponding sidewall of the package substrate 100 (such as a sum of width TW2 and the second distance D2).

In addition, the buffer layer 118 may be formed in the upper opening lib to prevent the electromagnetic interference (EMI). In some embodiments, the buffer layer 118 is formed from a metal material with high thermal conductivity (k), such as steel, stainless steel, copper, aluminum, copper tungsten, the like, or combinations thereof. In another embodiment, the buffer layer 118 includes a ceramic material. In yet another embodiment, the buffer layer 118 includes a silicon containing material. In yet another embodiment, the buffer layer 118 includes a composite alloy. In yet another embodiment, the buffer layer 118 includes a plastic material. In some embodiments, the buffer layer 118 and the lid layer 108 may have different materials. In the present embodiment, the buffer layer 118 is softer than the lid layer 108 to relieve the thermally-induced stress and prevent the EMI issues simultaneously. For example, the buffer layer 118 may be made of aluminum, and the lid layer 108 may be made of copper. However, the embodiments of the present disclosure are not limited thereto. In other embodiments, the buffer layer 118 and the lid layer 108 may have the same material, such as copper.

In some embodiments, the buffer layer 118 may be referred to as an embedded buffer/portion embedded in the lid layer 108, and may be formed by following steps illustrated in FIG. 15A to FIG. 15D. While disclosed method is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In some alternative embodiments, not all illustrated acts are required to implement one or more aspects or embodiments of the description herein. Further, one or more of the acts depicted herein may be carried out in one or more separate acts and/or phases.

Figure 15A:
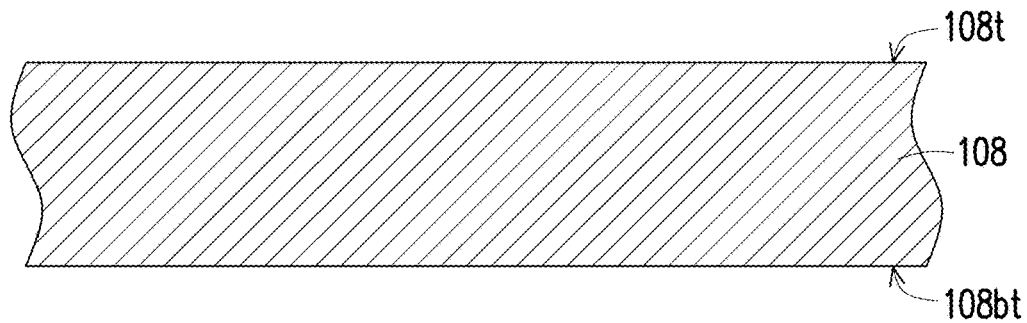
FIG. 15A to FIG. 15D are cross-sectional views of a method of forming a lid layer having a buffer layer in accordance with some alternative embodiments.

Referring to FIG. 15A, the lid layer 108 having a top surface 108t and a bottom surface 108bt opposite to each other is provided.

Figure 15B:
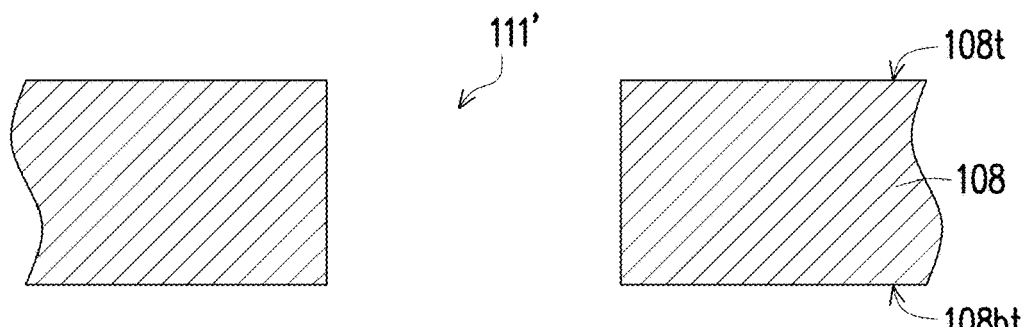

Referring to FIG. 15B, an opening 111' is formed to penetrate through the top surface 108t and the bottom surface 108bt of the lid layer 108. In some embodiments, the through opening 111' may be formed by using a mechanical drilling process, such as computer numerical control (CNC) lathes. However, the embodiments of the present disclosure are not limited thereto. In other embodiments, the through opening 111' may be formed by using a laser drilling process or the like.

Figure 15C:
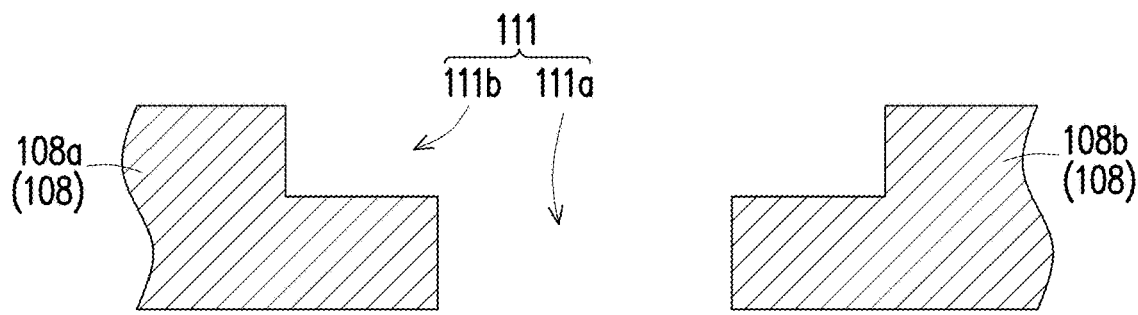

Referring to FIG. 15B and FIG. 15C, an upper portion of the opening 111' is widened to form the opening 111 with the narrower lower opening 111a and the wider upper opening 111b. In some embodiments, the upper opening 111b may be widened by using a mechanical drilling process, such as computer numerical control (CNC) lathes. In this case, the opening 111 may be formed as T-shape in the cross-sectional view of FIG. 15C. The lid layer 108 may be divided into a first portion 108a and a second portion 108b by the opening 111.

Figure 15D:
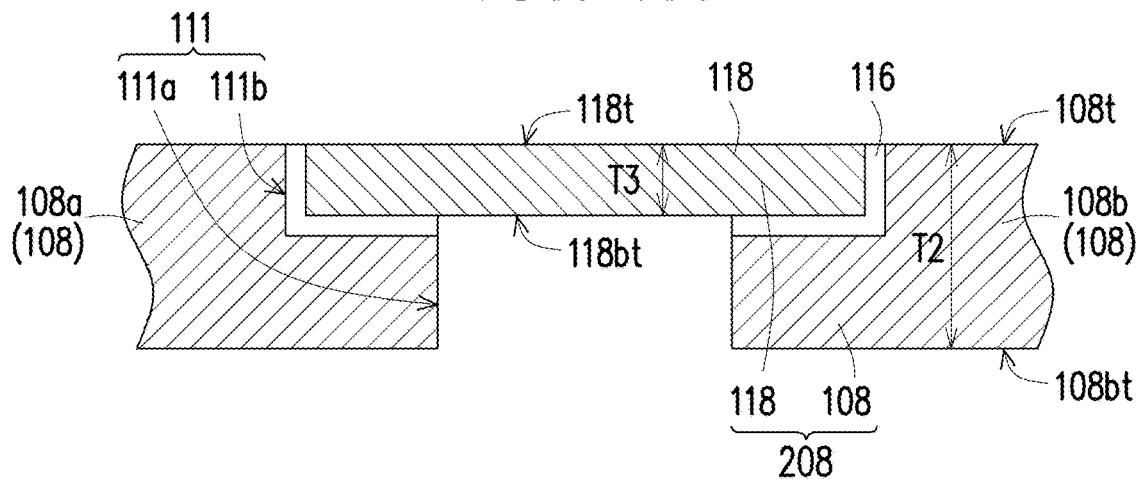

Referring to FIG. 15D, the buffer layer 118 is disposed in the upper opening 111b and connected to the upper opening 111b by a glue layer 116. Herein, the buffer layer 118 may be referred to as an embedded portion connecting the first portion 108a of the lid layer 108 overlying the first die 110 and the second portion 108b of the lid layer 108 overlying the stiffener ring 104, as shown in FIG. 1D. From another perspective, the lid layer 108 and the buffer layer 118 may constitute a lid structure 208. Specifically, the lid structure 208 may include a body portion (i.e., the lid layer 108) and an embedded portion (i.e., the buffer layer 118). The embedded portion 118 is connected to the body portion 108 by the glue layer 116. The embedded portion 118 has a top surface 118t and a bottom surface 118bt opposite to each other. The bottom surface 118bt of the embedded portion 118 may be exposed by the lower opening 111a, the bottom surface 118bt of the embedded portion 118 may be higher than the bottom surface 108bt of the lid layer 108, and the top surface 118t may be level (or coplanar) with the top surface 108t of the body portion 108. However, the embodiments of the present disclosure are not limited thereto. In other embodiments, the top surface 118t may be higher than or lower than the top surface 108t of the body portion 108. In some embodiments, the glue layer 116 includes any suitable adhesive, epoxy, die attach film (DAF), or the like. In some embodiments, the glue layer 116 and the adhesive layer 102/106 have the same material, such as DAF. In some alternative embodiments, the glue layer 116 and the adhesive layer 102/106 have different materials. For example, the adhesive layer 102/106 is DAF, and the glue layer 116 is silver glue. In addition, since the embedded portion 118 is only disposed in the upper opening 111b, the embedded portion 118 has a thickness T3 less than the thickness T2 of the body portion 108. In some embodiments, a thickness T3 of the embedded portion 118 measured between the top surface 118t and the bottom surface 118bt may be in a range of 100 μm to 900 μm. The thinned embedded portion 118 is able to effectively reduce the transfer of the thermally-induced stress from the first portion 108a to the second portion 108b, thereby avoiding the crack and/or delamination issue of the second adhesive layer 106 above the second portion 108b and enhancing the reliability of the package structure P1.

Figure 2:
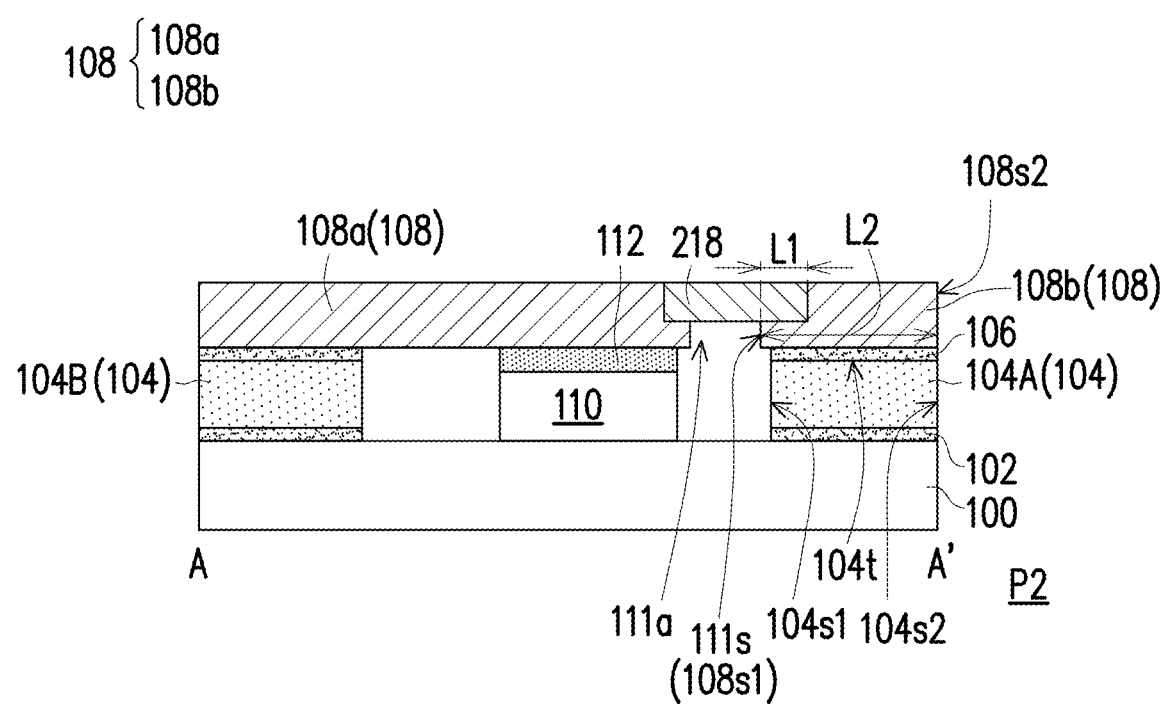
FIG. 2 is a cross-sectional view showing a package structure in accordance with a second embodiment.

FIG. 2 is a cross-sectional view showing a package structure in accordance with a second embodiment.

Referring to FIG. 2, a package structure P2 is similar to the package structure P1 of FIG. 1D, that is, the configurations, materials, and functions of the package structure P2 are similar to those of the package structure P1, and thus the details are omitted herein. The main difference between the package structure P2 and the package structure P1 lies in that the package structure P2 has a buffer layer 218 further extends to cover the top surface 104t of the first portion 104A of the stiffener ring 104. In detail, as shown in FIG. 2, the buffer layer 218 has an extending length L1 from the sidewall 111s of the lower opening 111a to overlying the top surface 104t of the first portion 104A, and the extending length L1 may be in a range of 900 µm to 4000 µm and L1 is smaller than L2. In addition, the second portion 108b of the lid layer 108 has a length L2 measured between the sidewall (inner sidewall) 108s1 and the sidewall (or outer sidewall) 108s2 of the lid layer 108, and the length L2 may be in a range of 900 µm to 4000 µm. In some embodiments, the extending length L1 is less than the length L2. In some alternative embodiments, the extending length L1 is less than one-half of the length L2. That is, the buffer layer 218 may be not extended beyond the center of the length L2 of the second portion 108b of the lid layer 108. In this case, the buffer layer 218 may provide a better stress reduction than the buffer layer 118, while maintaining the rigidity of the second portion 108b of the lid layer 108. Further, the first side 104s1 (or inner sidewall) of the stiffener ring 104 may be recessed or concave from the sidewall 111s of the lower opening 111a. In some embodiments, the first side 104s1 of the stiffener ring 104 is within the range of the extending length L1.

Figure 3A:
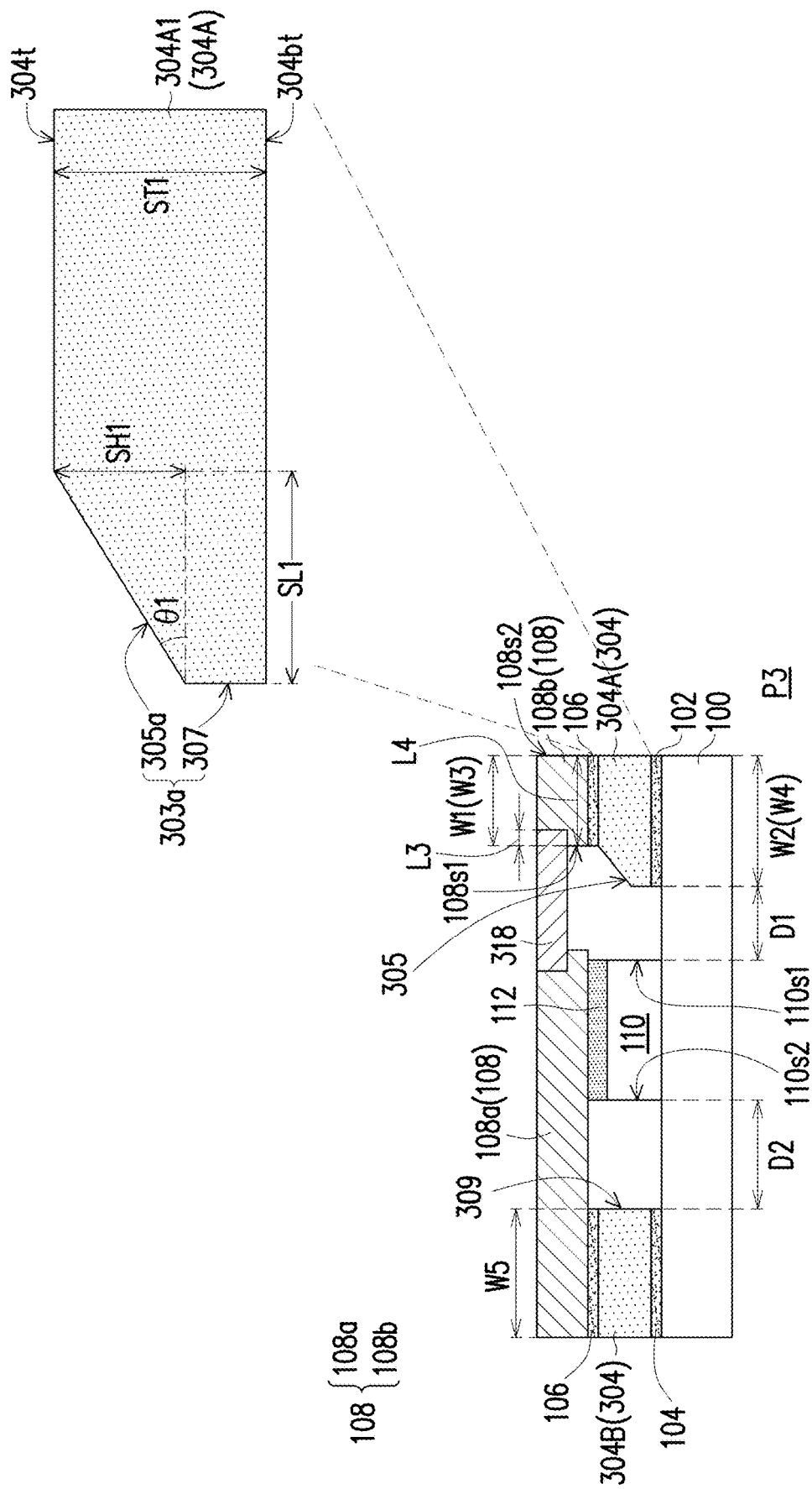
FIG. 3A is a cross-sectional view showing a package structure in accordance with a third embodiment.
Figure 3B:
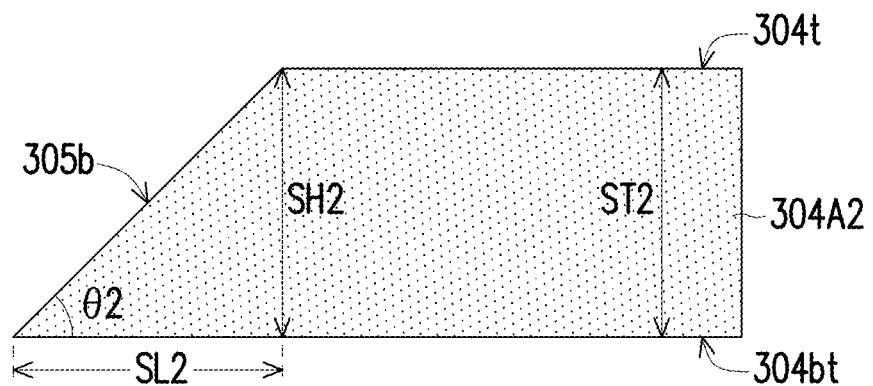
FIG. 3B to FIG. 3D are cross-sectional views showing a stiffener ring in accordance with various embodiments.
Figure 3C:
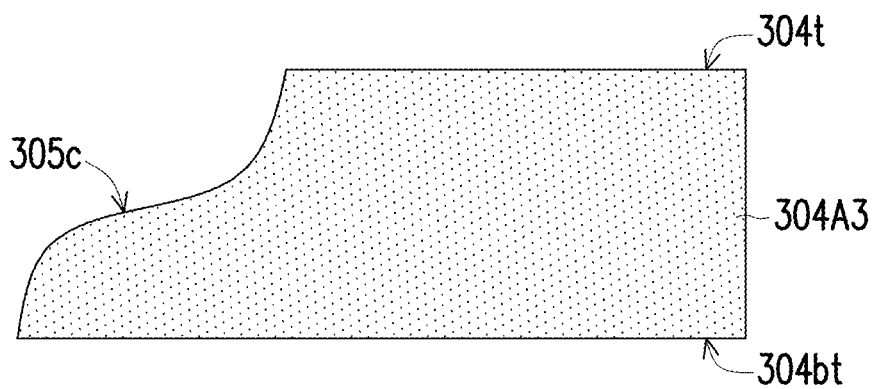
Figure 3D:
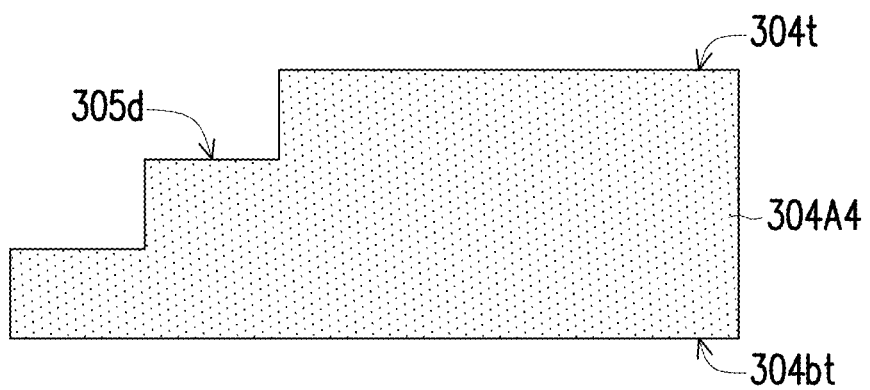

FIG. 3A is a cross-sectional view showing a package structure in accordance with a third embodiment. FIG. 3B to FIG. 3D are cross-sectional views showing a stiffener ring in accordance with various embodiments.

Referring to FIG. 3A, a package structure P3 is similar to the package structure P2 of FIG. 2, that is, the configurations, materials, and functions of the package structure P3 are similar to those of the package structure P2, and thus the details are omitted herein. The main difference between the package structure P3 and the package structure P2 lies in that the package structure P3 includes a stiffener ring 304 having a slant sidewall (or inclined sidewall) 305 facing the first sidewall 110si of the first die 110. When the first distance D1 is smaller than the second distance D2, the crack and/or delamination issue of the adhesive layers 102 and 106 may be occurred due to the stress concentration. In such embodiment, the first portion 304A of the stiffener ring 304 may have the slant sidewall 305 to decrease the rigidity of a first portion 304A of the stiffener ring 304 and increase the flexibility of the first portion 304A of the stiffener ring 304. Accordingly, the stress due to the CTE mismatch between the first die 110 and the package substrate 100 (or the lid layer 108) transmitted to the first portion 304A of the stiffener ring 304 can be effectively reduced, thereby avoiding the crack and/or delamination issue of the adhesive layers 102 and 106. It should be noted that, in the present embodiment, since the first portion 304A of the stiffener ring 304 has the slant sidewall 305, a width (or area) W1 of the top surface 304t of the first portion 304A is less than a width (or area) W2 of the bottom surface 304bt of the first portion 304A. In this case, the second adhesive layer 106 on the first portion 304A may have a width (or area) W3 is less than a width (or area) W4 of the first adhesive layer 102 between the first portion 304A and the package substrate 100. In some embodiments, the width W1 is substantially equal to the width W3, and the width W2 is substantially equal to the width W4. On the other hand, the second portion 304B, the second adhesive layer 106 on the second portion 304B, and the first adhesive layer 102 between the second portion 304B and the package substrate 100 may have the same width (or area) W5.

On the other hand, since the second distance D2 between the second sidewall 110s2 of the first die 110 and a second portion 304B of the stiffener ring 304 is far enough, the second portion 304B of the stiffener ring 304 may maintain a vertical sidewall 309 facing the second sidewall 110s2 of the first die 110. In some embodiments, the slant sidewall 305 is only formed on the first portion 304A of the stiffener ring 304 facing the first sidewall 110s1 of the first die 110. However, the embodiments of the present disclosure are not limited thereto. In some other embodiments, the slant sidewall 305 may surround all sidewalls of the first die 110. In such embodiment, the all-around slant sidewall 305 is able to comprehensively reduce the stress of the entire stiffener ring 304. In alternative embodiments, the slant sidewall 305 may be a continuously inclined structure or a non-continuously inclined structure.

In some embodiments, as shown in FIG. 3A, the buffer layer 318 has an extending length L3 overlapping with the top surface 304t of the stiffener ring 304, and the extending length L3 may be in a range of 900 µm to 4000 µm. In addition, the second portion 108b of the lid layer 108 has a length L4 measured between the sidewall (inner sidewall) 108s1 and the sidewall (or outer sidewall) 108s2 of the lid layer 108, and the length L4 may be in a range of 900 µm to 4000 µm. In some embodiments, the extending length L3 is less than the length L4. In some alternative embodiments, a ratio (L3/L4) of the extending length L3 to the length L4 is less than 1.0. That is, the buffer layer 318 may be not extended beyond the center of the length L4 of the second portion 108b of the lid layer 108. In this case, the buffer layer 318 may provide a better stress reduction than the buffer layer 118, while maintaining the rigidity of the second portion 108b of the lid layer 108.

In some embodiments, the first portion 304A of the stiffener ring 304 includes various shapes or profiles in the cross-sectional view, so as to avoid the crack or delamination issue of the adhesive layers 102 and 106. In one exemplary embodiment, as shown in the enlarged view of FIG. 3A, the first portion 304A1 may have a top surface 304t and a bottom surface 304bt opposite to each other. The inner sidewall 303a of the first portion 304A1 may have a slant sidewall 305a and a vertical sidewall 307. The vertical sidewall 307 is connected to the slant sidewall 305a and the bottom surface 304bt, and the slant sidewall 305a is connected to the vertical sidewall 307 and the top surface 304t. An angle θ1 between the slant sidewall 305a and the bottom surface 304bt is an acute angle. In some embodiments, the angle θ1 is in a range of 30 degree to 89.9 degree. A thickness ST1 of the first portion 304A1 measured between the top surface 304t and the bottom surface 304bt may be smaller than 4000 µm, a height SH1 of the slant sidewall 305a may be smaller than 4000 µm, and a length SL1 of the slant sidewall 305a may be smaller than 4000 µm. In the embodiments, as shown in FIG. 3A, the height SH1 of the slant sidewall 305a is less than the thickness ST1 of the first portion 304A1. In another embodiment, as shown in FIG. 3B, the first portion 304A2 may have a slant sidewall 305b connecting the top surface 304t and the bottom surface 304bt. In some embodiments, the angle θ2 is in a range of 45 degree to 89.9 degree. A thickness ST2 of the first portion 304A2 measured between the top surface 304t and the bottom surface 304bt may be in a range of 0.1 µm to 4000

μm, a height SH2 of the slant sidewall 305b may be in a range of 0.1 μm to 4000 μm, and a length SL2 of the slant sidewall 305b may be in a range of 0.1 μm to 4000 μm. In the embodiments, as shown in FIG. 3B, the height SH2 of the slant sidewall 305b is substantially equal to the thickness ST2 of the first portion 304A2. Although the slant sidewall 305a/305b illustrated in FIGS. 3A and 3B is a flat surface, the embodiments of the present disclosure are not limited thereto. In some other embodiments, as shown in FIG. 3C, the first portion 304A3 may have a slant sidewall 305c connecting the top surface 304t and the bottom surface 304bt, and the slant sidewall 305c is a curved surface. In some other embodiments, as shown in FIG. 3D, the first portion 304A4 may have a slant sidewall 305d connecting the top surface 304t and the bottom surface 304bt, and the slant sidewall 305d is a staircase surface.

Figure 4:
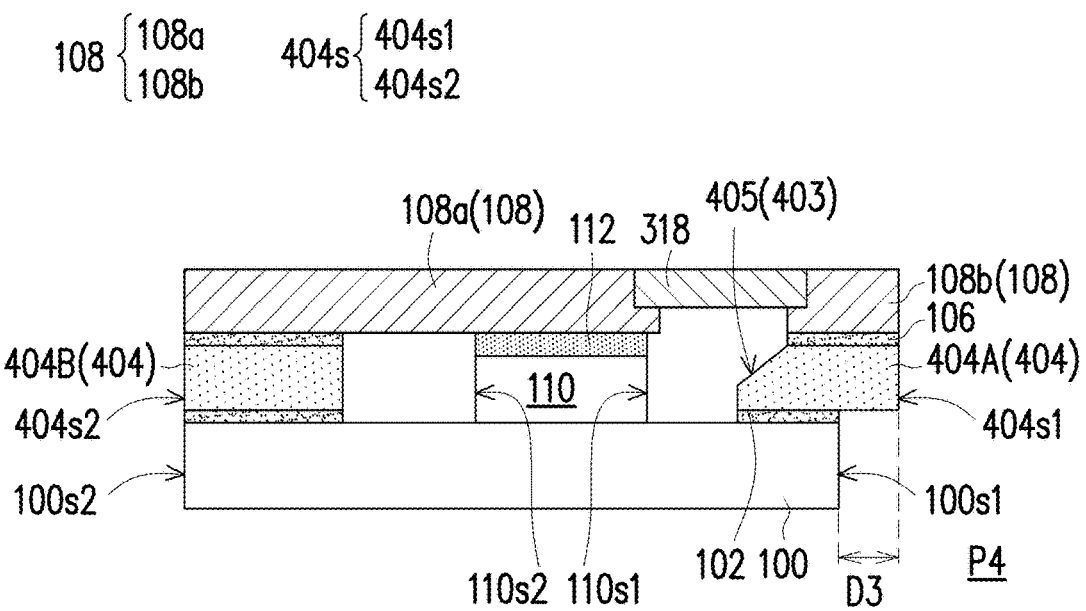
FIG. 4 is a cross-sectional view showing a package structure in accordance with a fourth embodiment.

FIG. 4 is a cross-sectional view showing a package structure in accordance with a fourth embodiment.

Referring to FIG. 4, a package structure P4 is similar to the package structure P3 of FIG. 3A, that is, the configurations, materials, and functions of the package structure P4 are similar to those of the package structure P3, and thus the details are omitted herein. The main difference between the package structure P4 and the package structure P3 lies in that the package structure P4 has a stiffener ring 404 protruding from the package substrate 100. Specifically, as shown in FIG. 4, the stiffener ring 404 may have an outer sidewall 404s opposite to the inner sidewall 403 (or slant sidewall 405). The stiffener ring 404 may include a first portion 404A and a second portion 404B. The first portion 404A may be adjacent to the first sidewall 110s1 of the first die 110, and the second portion 404B may be adjacent to the second sidewall 110s2 of the first die 110 opposite to the first sidewall 110s1. The first portion 404A of the stiffener ring 404 may have a first outer sidewall 404s1 protruding from a sidewall 100s1 of the package substrate 100 by a distance D3. In some embodiments, the distance D3 is in a range of 0.1 μm to 3000 μm, such as 1200 μm. On the other hand, the second portion 404B of the stiffener ring 404 may have a second outer sidewall 404s2 aligned with a sidewall 100s2 of the package substrate 100. It should be noted that the first portion 404A of the stiffener ring 404 may overhang on the package substrate 100 to increase the flexibility of the first portion 404A, thereby relieving the stress on the first portion 404A. In this case, the crack and/or delamination issue of the adhesive layers 102 and 106 are avoided, thereby improving the reliability and the yield of the package structure P4 is improved.

Figure 5:
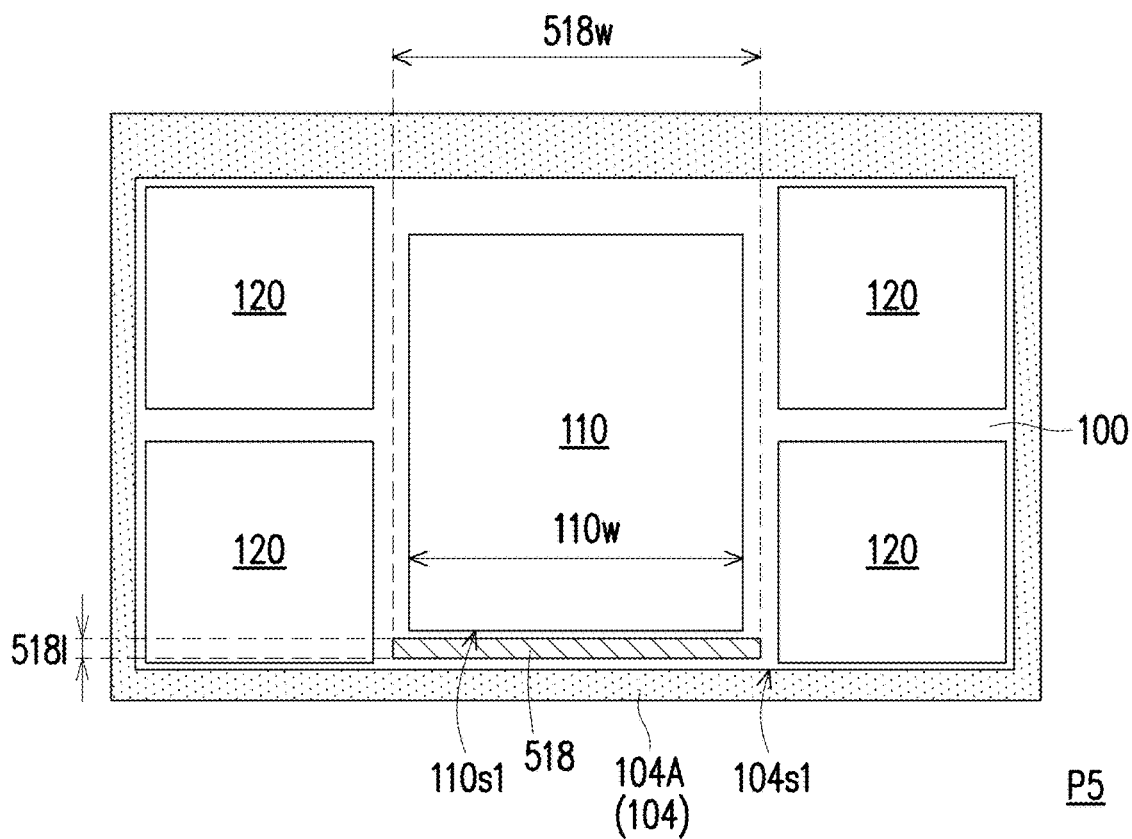
FIG. 5 is a top view showing a package structure in accordance with a fifth embodiment.

FIG. 5 illustrates a package structure P5 with a buffer layer 518 embedded in the lid layer in accordance with a fifth embodiment. In the present embodiment, the lid layer is omitted in FIG. 5 to clearly illustrate the relationship between the buffer layer 518 and the first die 110 and/or the stiffener ring 104.

Referring to FIG. 5, the package structure P5 is similar to the package structure P1 of FIG. 1A, that is, the configurations, materials, and functions of the package structure P5 are similar to those of the package structure P1, and thus the details are omitted herein. In the present embodiment, the package structure P5 includes the buffer layer 518 having a width 518w greater than or substantially equal to the width 110w of the first die 110. In some embodiments, the buffer layer 518 may be disposed between the first portion 104A of the stiffener ring 104 and the first die 110. That is, the buffer layer 518 has a length 518l within a range between the first side 104s1 of the stiffener ring 104 and the first sidewall 110s1 of the first die 110. In some alternative embodiments, the length 518l of the buffer layer 518 may be widened, so that the buffer layer 518 further covers the top surface 104t of the first portion 104A of the stiffener ring 104, as shown in the cross-sectional view of FIG. 2.

Figure 6:
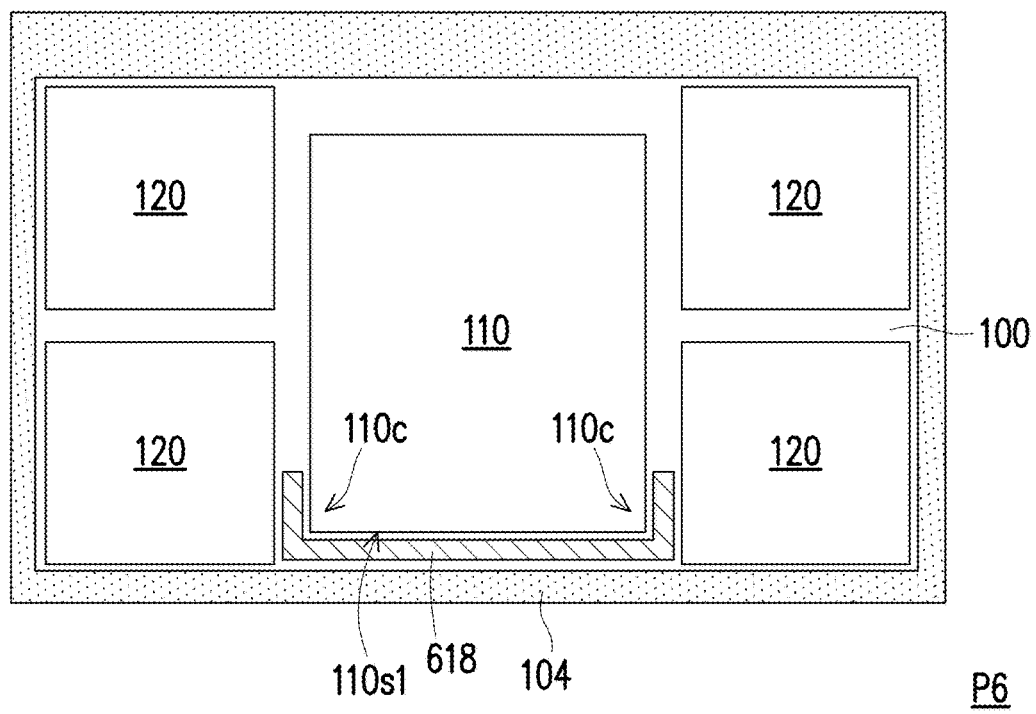
FIG. 6 is a top view showing a package structure in accordance with a sixth embodiment.

FIG. 6 illustrates a package structure P6 with a buffer layer 618 embedded in the lid layer in accordance with a sixth embodiment. In the present embodiment, the lid layer is omitted in FIG. 6 to clearly illustrate the relationship between the buffer layer 618 and the first die 110 and/or the stiffener ring 104.

Referring to FIG. 6, the package structure P6 is similar to the package structure P5 of FIG. 5, that is, the configurations, materials, and functions of the package structure P6 are similar to those of the package structure P5, and thus the details are omitted herein. In the present embodiment, the package structure P6 includes the buffer layer 618 not only overlying the first sidewall 110s1 of the first die 110, but also further extending to cover at least two corners 110c of the first die 110. Usually, the highest stress may be at the regions close to the corners 110c of the first die 110. In such embodiment, the buffer layer 618 is able to provide a better protection to reduce the stress concentrated at the corners 110c of the first die 110.

Figure 7:
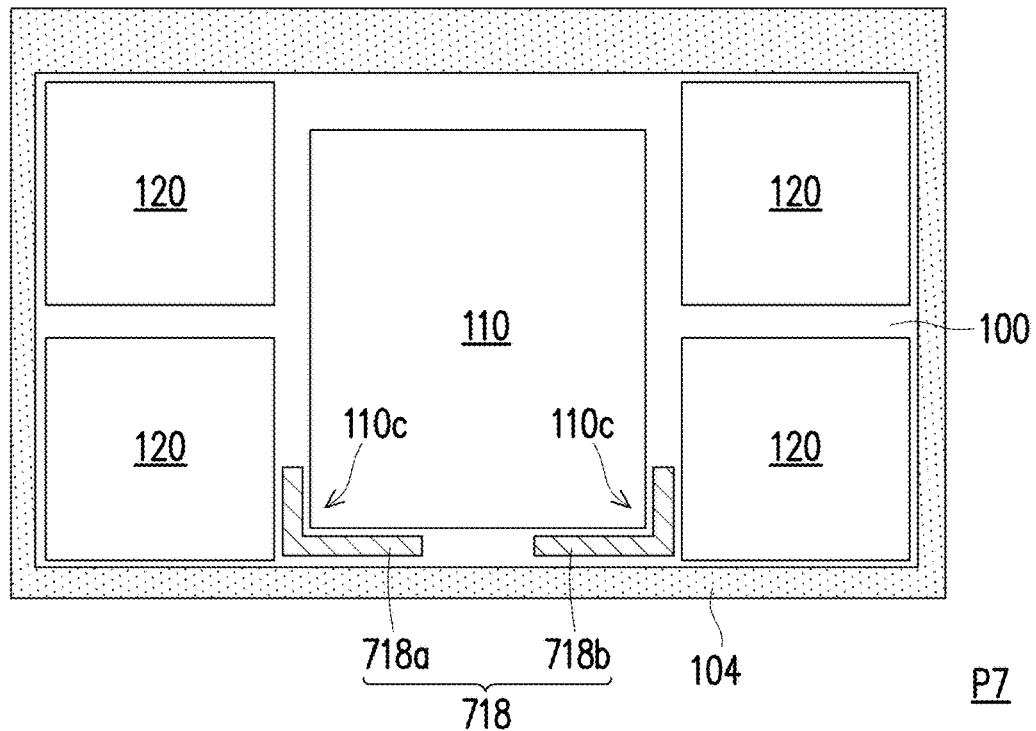
FIG. 7 is a top view showing a package structure in accordance with a seventh embodiment.

FIG. 7 illustrates a package structure P7 with a buffer layer 718 embedded in the lid layer in accordance with a seventh embodiment. In the present embodiment, the lid layer is omitted in FIG. 7 to clearly illustrate the relationship between the buffer layer 718 and the first die 110 and/or the stiffener ring 104.

Referring to FIG. 7, the package structure P7 is similar to the package structure P6 of FIG. 6, that is, the configurations, materials, and functions of the package structure P7 are similar to those of the package structure P6, and thus the details are omitted herein. In the present embodiment, the buffer layer 718 of the package structure P7 includes at least two sub-layers 718a and 718b respectively covering two corners 110c of the first die 110. In such embodiment, the buffer layer 718 is able to provide a better protection to reduce the stress concentrated at the corners 110c of the first die 110.

Figure 8:
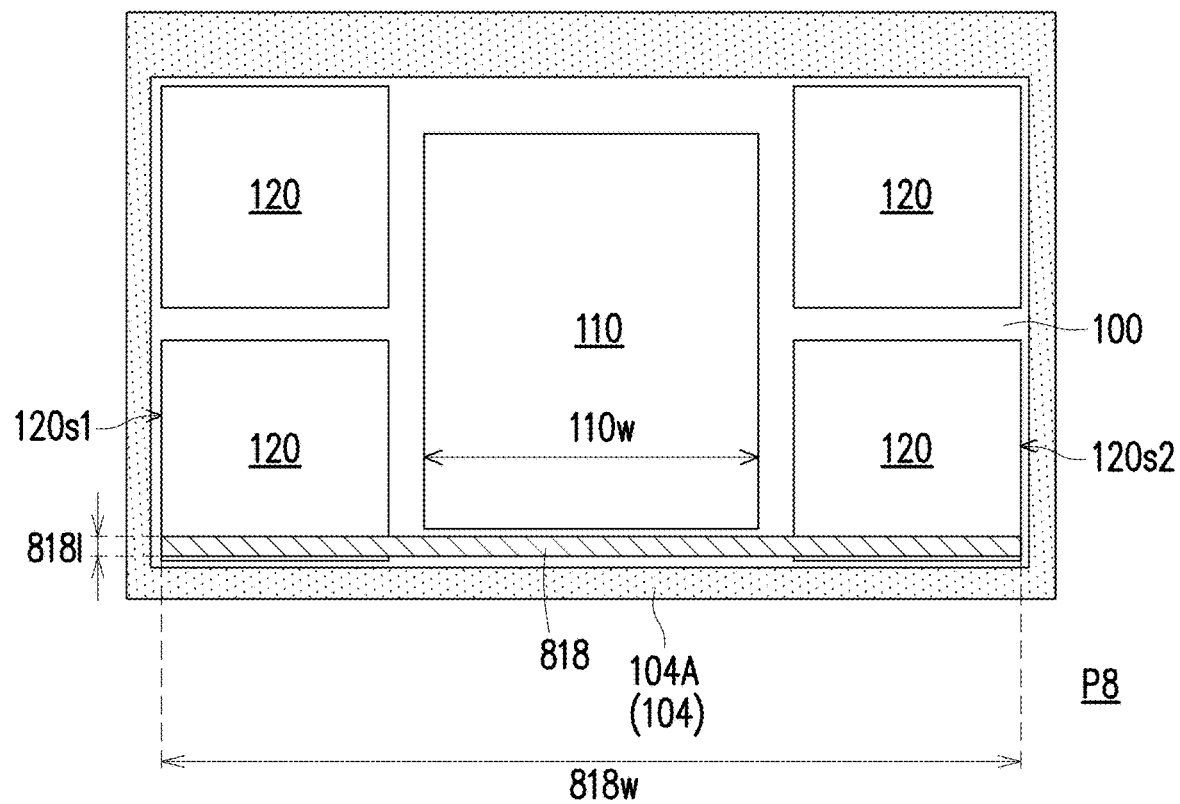
FIG. 8 is a top view showing a package structure in accordance with an eighth embodiment.

FIG. 8 illustrates a package structure P8 with a buffer layer 818 embedded in the lid layer in accordance with an eighth embodiment. In the present embodiment, the lid layer is omitted in FIG. 8 to clearly illustrate the relationship between the buffer layer 818 and the first die 110 and/or the stiffener ring 104.

Referring to FIG. 8, the package structure P8 is similar to the package structure P5 of FIG. 5, that is, the configurations, materials, and functions of the package structure P8 are similar to those of the package structure P5, and thus the details are omitted herein. In the present embodiment, the buffer layer 818 of the package structure P8 has a width 818w greater than the width 110w of the first die 110, and the buffer layer 818 further extends to cover the top surfaces of the second dies 120 aside the first die 110. In some embodiments, the width 818w of the buffer layer 818 may be extended from the first sidewall 120s1 of the left second die 120 and the second sidewall 120s2 of the right second die 120. In such embodiment, the buffer layer 818 is able to further reduce the stress between the second dies 120 and the stiffener ring 104. In some embodiments, the buffer layer 818 may be disposed between the first portion 104A of the stiffener ring 104 and the first die 110. That is, the buffer layer 818 has a length 818l within a range between the first side 104s1 of the stiffener ring 104 and the first sidewall 110s1 of the first die 110. In some alternative embodiments, the length 818l of the buffer layer 818 may be widened, so that the buffer layer 818 further covers the top surface 104t of the first portion 104A of the stiffener ring 104, as shown in the cross-sectional view of FIG. 2.

Figure 9:
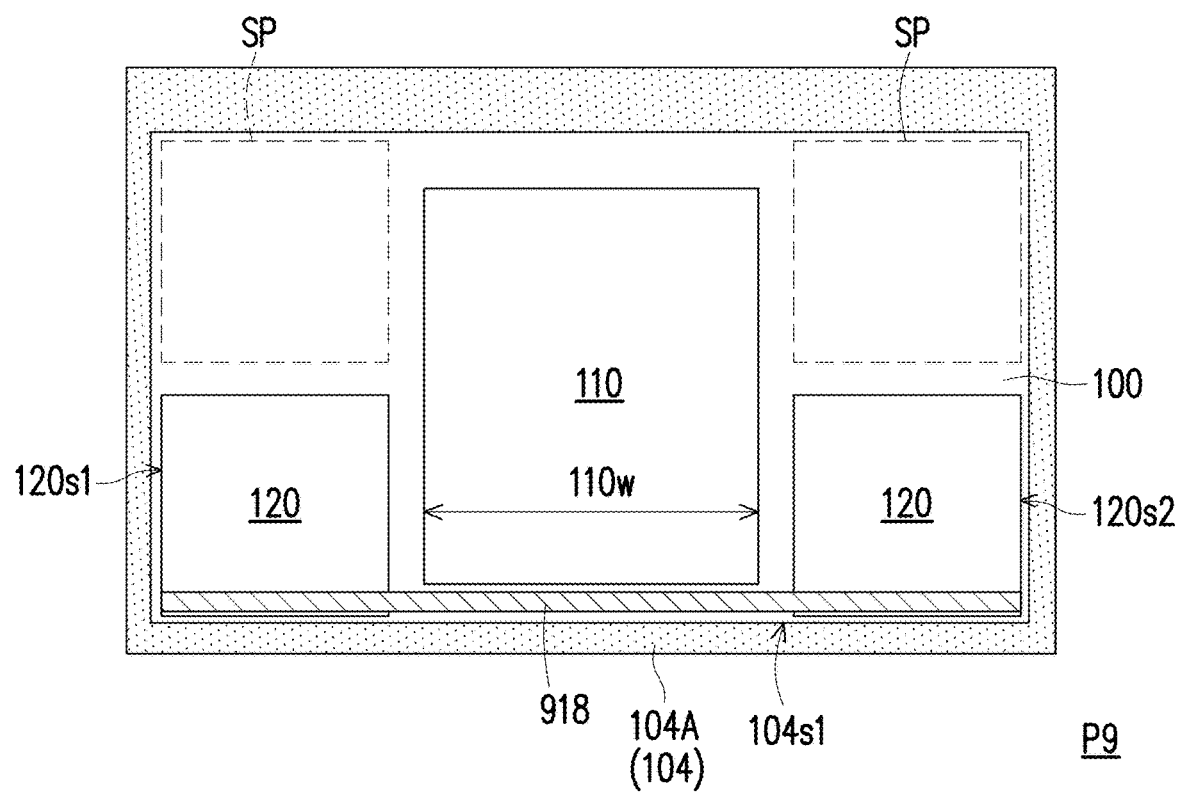
FIG. 9 is a top view showing a package structure in accordance with a ninth embodiment.

FIG. 9 illustrates a package structure P9 with a buffer layer 918 embedded in the lid layer in accordance with a ninth embodiment. In the present embodiment, the lid layer is omitted in FIG. 9 to clearly illustrate the relationship between the buffer layer 918 and the first die 110 and/or the stiffener ring 104.

Referring to FIG. 9, the package structure P9 is similar to the package structure P8 of FIG. 8, that is, the configurations, materials, and functions of the package structure P9 are similar to those of the package structure P8, and thus the details are omitted herein. The main difference between the package structure P9 and the package structure P8 lies in that the package structure P9 has two second dies 120 offset from a center of the substrate 100 to close to the first portion 104A of the stiffener ring 104. Accordingly, the second dies 120 are also referred to as eccentric dies. When the second dies 120 are offset from the center of the substrate 100 to make more spaces SP for the passive components, the thermally-induced stress will focus on the first side 104s1 of the stiffener ring 104 close to the second dies 120. In this case, the stress due to the CTE mismatch may cause the delamination or crack issue of the adhesive layers 102 and 106 on and below the stiffener ring 104. In order to solve the said localized stress concentration issue, in the present embodiment, as shown in FIG. 9, the buffer layer 918 further extends to cover the top surfaces of the second dies 120 aside the first die 110, and the buffer layer 918 may relieve the stress concentrated on the first side 104s1 of the stiffener ring 104 close to the second dies 120, thereby avoiding the crack and/or delamination issue of the adhesive layers 102/106 and enhancing the reliability of the package structure P9.

Figure 10:
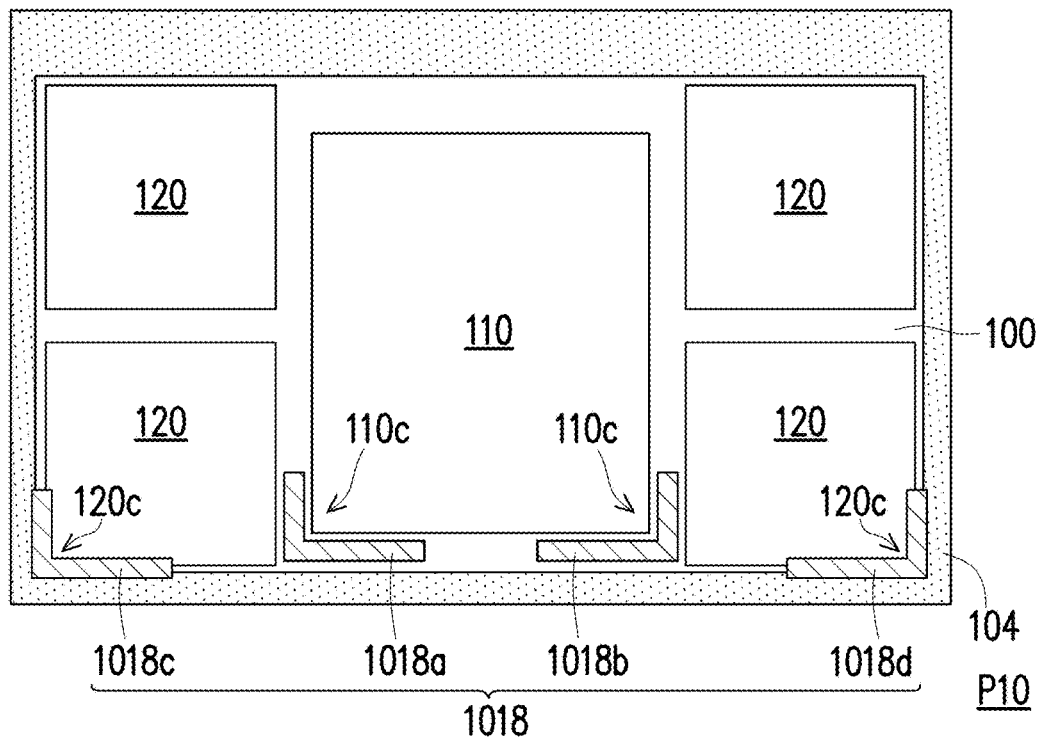
FIG. 10 is a top view showing a package structure in accordance with a tenth embodiment.

FIG. 10 illustrates a package structure P10 with a buffer layer 1018 embedded in the lid layer in accordance with a tenth embodiment. In the present embodiment, the lid layer is omitted in FIG. 10 to clearly illustrate the relationship between the buffer layer 1018 and the first die 110 and/or the stiffener ring 104.

Referring to FIG. 10, the package structure P10 is similar to the package structure P7 of FIG. 7, that is, the configurations, materials, and functions of the package structure P10 are similar to those of the package structure P7, and thus the details are omitted herein. In the present embodiment, the buffer layer 1018 of the package structure P10 includes at least four sub-layers 1018a, 1018b, 1018c, and 1018d respectively covering two corners 110c of the first die 110 and two corners 120c of the second dies 120. Usually, the highest stress may be at the regions close to the corners 110c of the first die 110 and the corners 120c of the second dies 120. In such embodiment, the buffer layer 1018 is able to provide a better protection to reduce the stress concentrated at the corners 110c of the first die 110 and the corners 120c of the second dies 120.

Figure 11:
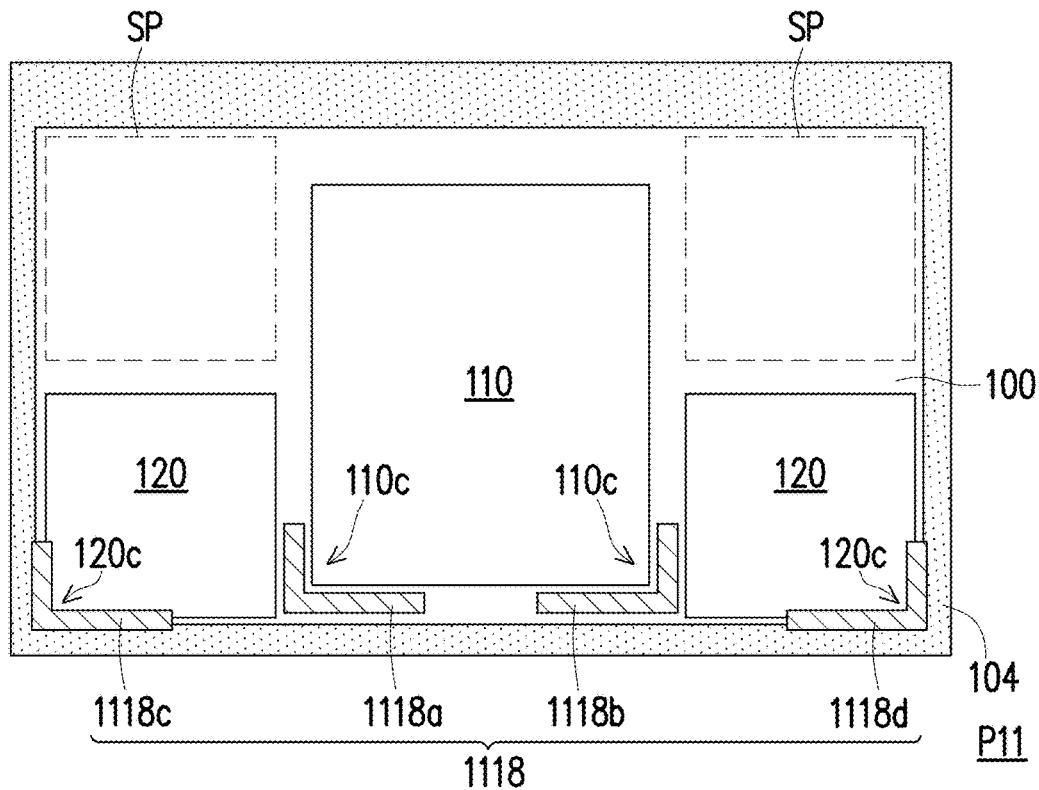
FIG. 11 is a top view showing a package structure in accordance with an eleventh embodiment.

FIG. 11 illustrates a package structure P11 with a buffer layer 1118 embedded in the lid layer in accordance with an eleventh embodiment. In the present embodiment, the lid layer is omitted in FIG. 11 to clearly illustrate the relationship between the buffer layer 1118 and the first die 110 and/or the stiffener ring 104.

Referring to FIG. 11, the package structure P11 is similar to the package structure P10 of FIG. 10, that is, the configurations, materials, and functions of the package structure P11 are similar to those of the package structure P10, and thus the details are omitted herein. The main difference between the package structure P11 and the package structure P10 lies in that the package structure P11 has two second dies 120 offset from a center of the substrate 100 to close to the first portion 104A of the stiffener ring 104. Accordingly, the second dies 120 are also referred to as eccentric dies. When the second dies 120 are offset from the center of the substrate 100 to make more spaces SP for the passive components, the thermally-induced stress will focus on the first side 104s1 of the stiffener ring 104 close to the second dies 120. In this case, the stress due to the CTE mismatch may cause the delamination or crack issue of the adhesive layers 102 and 106 on and below the stiffener ring 104. In order to solve the said localized stress concentration issue, in the present embodiment, as shown in FIG. 11, the buffer layer 1118 includes at least four sub-layers 1118a, 1118b, 1118c, and 1118d respectively covering two corners 110c of the first die 110 and two corners 120c of the second dies 120. Therefore, the buffer layer 1118 may relieve the stress concentrated at the corners 110c of the first die 110 and the corners 120c of the second dies 120, thereby avoiding the crack and/or delamination issue of the adhesive layers 102/106 and enhancing the reliability of the package structure P11.

Figure 12:
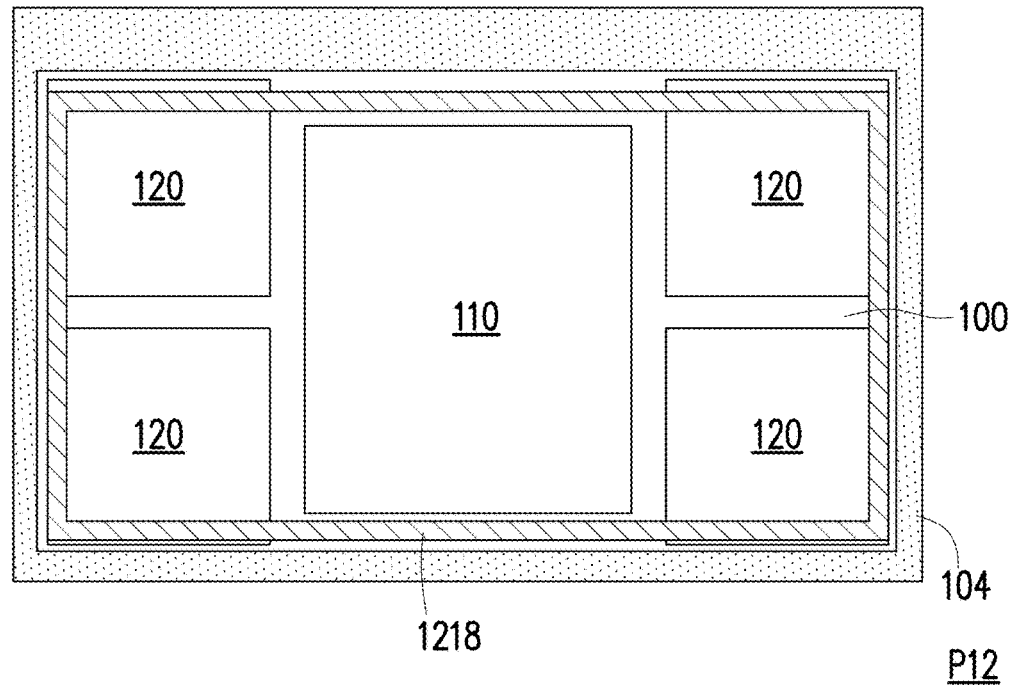
FIG. 12 is a top view showing a package structure in accordance with a twelfth embodiment.

FIG. 12 illustrates a package structure P12 with a buffer layer 1218 embedded in the lid layer in accordance with a twelfth embodiment. In the present embodiment, the lid layer is omitted in FIG. 12 to clearly illustrate the relationship between the buffer layer 1218 and the first die 110 and/or the stiffener ring 104.

Referring to FIG. 12, the package structure P12 is similar to the package structure P1 of FIG. 1A, but the buffer layer 1218 surrounds all sidewalls of the first die 110 and the second dies 120 along the inner sidewall 103. In such embodiment, the all-around buffer layer 1218 is able to comprehensively reduce the stress of the entire stiffener ring 104. The all-around buffer layer 1218 may be also offset along a first direction Y, from a center of the package, corresponding to the eccentric first die 110, and substantially symmetrical along a second direction X in some embodiment, but not limited thereto.

Figure 13:
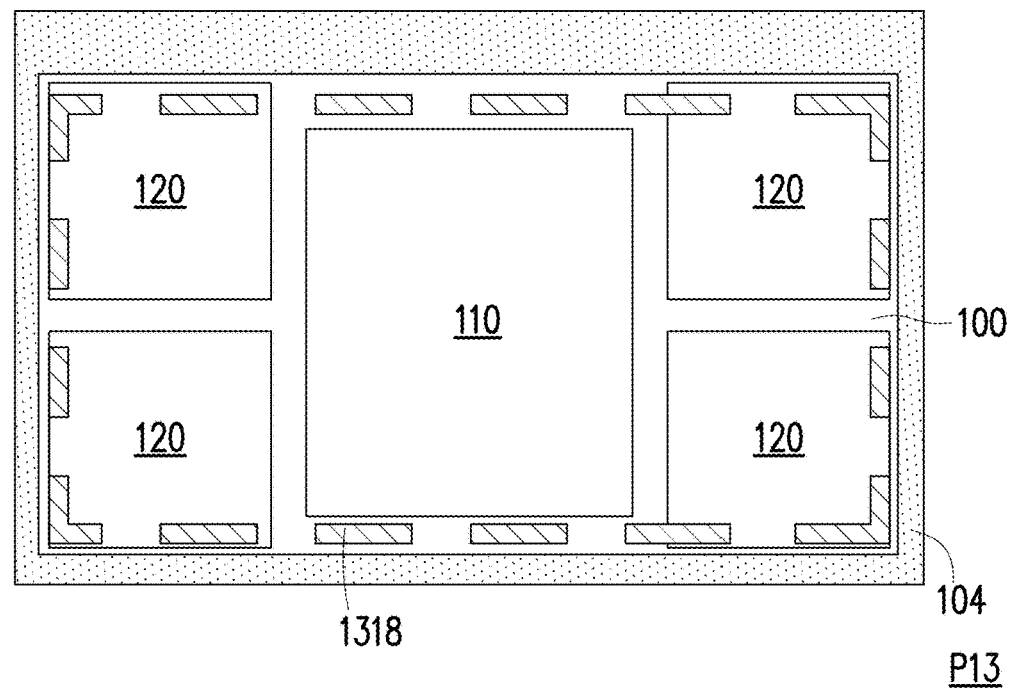
FIG. 13 is a top view showing a package structure in accordance with a thirteenth embodiment.

Although the buffer layer 1218 illustrated in FIG. 12 is a continuous structure, the embodiments of the present disclosure are not limited thereto. In other embodiments, a package structure P13 has a buffer layer 1318 with a non-continuous structure, as shown in FIG. 13. In some alternative embodiments, the buffer layer 518, 618, 718, 818, 918, 1018 or 1118 of the package structure P5, P6, P7, P8, P9, P10 or P11 with the continuous structure can also be replaced by the non-continuous structure.

Further, the package structures P5 to P13 of FIGS. 5-13 illustrate the first die 110 is an eccentric die offset from a center of the accommodation area AA. However, the embodiments of the present disclosure are not limited thereto. In some alternative embodiments, the first die 110 may be a non-eccentric die. That is, as shown in a package structure P14 of FIG. 14, the first distance D1 between the first sidewall 110s1 of the first die 110 and the first portion 104A is substantially equal to the second distance D2 between the second sidewall 110s2 of the first die 110 and the second portion 104B. In such embodiment, whether the first die 110 is close to any side of the stiffener ring 104 or not, as long as a distance between the first die 110 and the stiffener ring 104 is close enough to cause excessive stress, the buffer layer 1418 is able to solve the crack or delamination issue of the adhesive layers 102/106, thereby improving the reliability and the yield of the package structure P14.

Figure 14:
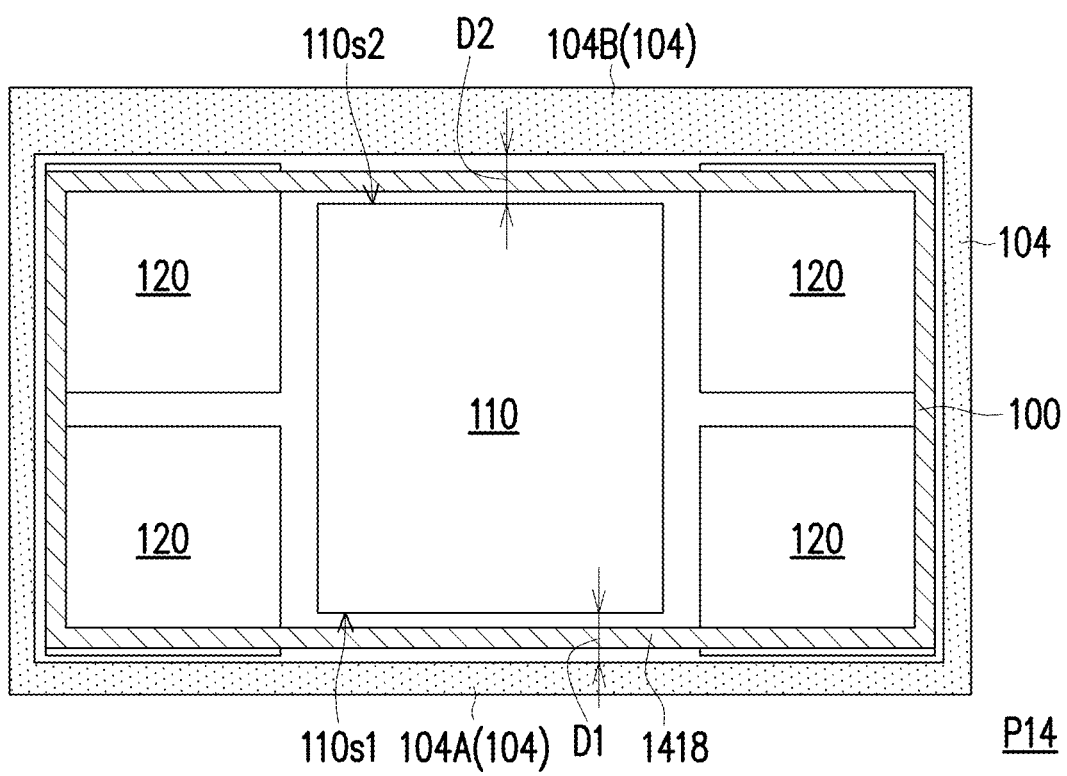
FIG. 14 is a top view showing a package structure in accordance with a fourteenth embodiment.

Although the buffer layer 1418 illustrated in FIG. 14 is an all-around buffer layer, the embodiments of the present disclosure are not limited thereto. In other embodiments, the buffer layer 1418 of the package structure P14 may be the same configuration with the buffer layer 518, 618, 718, 818, 918, 1018, 1118 or 1318 of the package structure P5, P6, P7, P8, P9, P10, P11 or P13.

Moreover, the stiffener ring 304 with the slant sidewall 305 illustrated in FIG. 3A may be added to any one of the buffer layers 518, 618, 718, 818, 918, 1018, 1118, 1218, and 1318 of the package structures P5, P6, P7, P8, P9, P10, P11, P12, and P13, so as to achieve the effect of dramatically reducing the stress due to CTE mismatch.

In accordance with an embodiment, a package structure includes a substrate, a stiffener ring, an eccentric die, a lid layer, and a buffer layer. The stiffener ring is disposed on the substrate. The stiffener ring has an inner perimeter to enclose an accommodation area. The eccentric die is disposed within the accommodation area on the substrate. The eccentric die is offset from a center of the accommodation area to close to a first side of the stiffener ring. The lid layer is disposed on the stiffener ring and overlays the eccentric die. The buffer layer is embedded in the lid layer between the first side of the stiffener ring and the eccentric die. The buffer layer has a thickness less than a thickness of the lid layer.

In accordance with an embodiment, a package structure includes a package substrate, a first die, a stiffener ring, a lid layer, and an embedded buffer. The first die is disposed on the package substrate and has a first sidewall and a second sidewall opposite to each other. The stiffener ring is disposed on the package substrate to surround the first die, wherein the stiffener ring has an inner sidewall facing the first die, and the inner sidewall at least has a slant sidewall facing the first sidewall of the first die. The lid layer is disposed on the stiffener ring and overlying the first die. The embedded buffer connects a first portion of the lid layer overlying the first die and a second portion of the lid layer overlying the stiffener ring, wherein the embedded buffer has a bottom surface higher than a bottom surface of the lid layer.

In accordance with an embodiment, a method of forming a package structure includes: forming a first die on a package substrate, wherein the first die has a first sidewall and a second sidewall opposite to each other; forming a plurality of second dies side by side on the package substrate, wherein the first die is formed between the plurality of second dies; forming a stiffener ring on the package substrate to surround the first die and the plurality of second dies; and forming a lid structure on the stiffener ring to overlay the first die and the plurality of second dies. The lid structure includes: a body portion; and an embedded portion, at least formed between the first sidewall of the first die and the stiffener ring, wherein the embedded portion is connected to the body portion by a glue layer.

In accordance with an embodiment, a package structure includes a package substrate, a first die, a plurality of second dies, a stiffener ring, and a lid structure. The first die is disposed on the package substrate and having a first sidewall and a second sidewall opposite to each other. The plurality of second dies are side by side disposed on the package substrate, wherein the first die is disposed between the plurality of second dies. The stiffener ring is disposed on the package substrate to surround the first die and the plurality of second dies. The lid structure is disposed on the stiffener ring and overlying the first die and the plurality of second dies. The lid structure includes a body portion; and an embedded portion at least disposed between the first sidewall of the first die and the stiffener ring. The embedded portion is connected to the body portion by a glue layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a package structure, comprising:
   forming a first die on a package substrate, wherein the first die has a first sidewall and a second sidewall opposite to each other;
   forming a stiffener ring on the package substrate to surround the first die, wherein the stiffener ring has a first inner sidewall and a second inner sidewall opposite to each other, a first distance between the first sidewall of the first die and the first inner sidewall of the stiffener ring is less than a second distance between the second sidewall of the first die and the second inner sidewall of the stiffener ring, and the first sidewall of the first die encloses a space with the first inner sidewall of the stiffener ring;
   forming a lid layer on the stiffener ring to overlay the first die;
   forming an opening to penetrate through a top surface and a bottom surface of the lid layer, wherein the opening is directly over the space enclosed by the first sidewall of the first die and the first inner sidewall of the stiffener ring; and
   forming a stress-relief layer in the opening.

2. The method of claim 1, further comprising: widening an upper portion of the opening to form a narrower lower opening and a wider upper opening.

3. The method of claim 2, wherein the stress-relief layer is formed in the wider upper opening without extending into the narrower lower opening.

4. The method of claim 1, wherein the stress-relief layer and the lid layer have different materials.

5. The method of claim 1, wherein the stress-relief layer is softer than the lid layer.

6. The method of claim 1, wherein the stress-relief layer is connected to the lid layer by a glue layer.

7. The method of claim 1, wherein the stress-relief layer has a thickness less than a thickness of the lid layer.

8. The method of claim 1, further comprising: forming a plurality of second dies side by side on the package substrate before forming the stiffener ring, wherein the first die is formed between the plurality of second dies.

9. A method of forming a package structure, comprising:
   forming a first die on a package substrate, wherein the first die has a first sidewall and a second sidewall opposite to each other;
   forming a stiffener ring on the package substrate to surround the first die, wherein the stiffener ring has an inner sidewall facing the first die, and the inner sidewall at least has a slant sidewall facing the first sidewall of the first die;
   forming a lid layer on the stiffener ring to overlay the first die; and forming an embedded buffer in the lid layer, wherein the embedded buffer connects a first portion of the lid layer overlying the first die and a second portion of the lid layer overlying the stiffener ring, and the embedded buffer has a bottom surface higher than a bottom surface of the lid layer.

10. The method of claim 9, wherein the inner sidewall of the stiffener ring has a vertical sidewall facing the second sidewall of the first die.

11. The method of claim 10, wherein a first distance between the first sidewall of the first die and the slant sidewall of the stiffener ring is less than or equal to a second distance between the second sidewall of the first die and the vertical sidewall of the stiffener ring.

12. The method of claim 9, further comprising:
   a plurality of second dies, side by side disposed on the package substrate, wherein the first die is disposed between the plurality of second dies;
   a thermal interface material (TIM) disposed between the first die and the lid layer
   a first adhesive layer, disposed between the stiffener ring and the package substrate; and
   a second adhesive layer, disposed on the stiffener ring, wherein the lid layer is adhered on the stiffener ring by the second adhesive layer, and overlays the first die and the plurality of second dies.

13. The method of claim 12, wherein the first die has a coefficient of thermal expansion (CTE) less than a CTE of the plurality of second dies.

14. The method of claim 9, wherein the stiffener ring has an outer sidewall opposite to the inner sidewall, and the outer sidewall protrudes from a sidewall of the package substrate.

15. The method of claim 9, wherein the embedded buffer and the lid layer have different materials.

16. The method of claim 9, wherein the embedded buffer is softer than the lid layer.

17. A method of forming a package structure, comprising:
   providing a stiffener ring, wherein the stiffener ring has an inner perimeter to enclose an accommodation area;
   placing a die within the accommodation area, wherein the die is offset from a center of the accommodation area to close to a first side of the stiffener ring;
   forming a lid layer to cover the stiffener ring and the die; and
   forming a buffer layer in the lid layer between the first side of the stiffener ring and the die, wherein the buffer layer has a bottom surface higher than a bottom surface of the lid layer.

18. The method of claim 17, wherein the buffer layer further extends to cover at least two corners of the die.

19. The method of claim 17, wherein the buffer layer further extends to cover a top surface of the stiffener ring.

20. The method of claim 17, wherein the buffer layer surrounds all sidewalls of the die.

* * * * *